(12) United States Patent
Sasaki et al.

(10) Patent No.: US 11,191,172 B2
(45) Date of Patent: Nov. 30, 2021

(54) DISPLAY DEVICE

(71) Applicant: Japan Display Inc., Tokyo (JP)

(72) Inventors: Tohru Sasaki, Tokyo (JP); Hajime Akimoto, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 16/899,608

(22) Filed: Jun. 12, 2020

(65) Prior Publication Data

US 2020/0315039 A1   Oct. 1, 2020

Related U.S. Application Data

(63) Continuation of application No. PCT/JP2018/035042, filed on Sep. 21, 2018.

(30) Foreign Application Priority Data

Dec. 15, 2017   (JP) .............................. JP2017-240545

(51) Int. Cl.
*H05K 5/00* (2006.01)
*H05K 5/02* (2006.01)
*H01L 51/52* (2006.01)

(52) U.S. Cl.
CPC ....... *H05K 5/0017* (2013.01); *H01L 51/5237* (2013.01); *H05K 5/0217* (2013.01)

(58) Field of Classification Search
CPC ................ H05K 5/0017; H05K 5/0217; G06F 1/1652; G06F 1/1656; G06F 1/1681; G09F 9/30

See application file for complete search history.

(56) References Cited

U.S. PATENT DOCUMENTS

| 8,228,667 | B2 * | 7/2012 | Ma | ........................ | G06F 1/1652 361/679.01 |
| 10,271,438 | B2 * | 4/2019 | Hirakata | .............. | H01L 27/3262 |
| 2012/0147599 | A1 * | 6/2012 | Shim | ...................... | G06F 1/1652 362/231 |
| 2012/0149438 | A1 * | 6/2012 | Kwon | .................... | H04M 1/022 455/566 |

(Continued)

FOREIGN PATENT DOCUMENTS

JP   2002-278466 A   9/2002
JP   2014-519626 A   8/2014

OTHER PUBLICATIONS

International Search Report and Written Opinion dated Nov. 13, 2018 for PCT/JP2018/035042 filed on Sep. 21, 2018, 9 pages including English Translation of the International Search Report.

*Primary Examiner* — Abhishek M Rathod
(74) *Attorney, Agent, or Firm* — Xsensus LLP

(57) ABSTRACT

A display device according to the disclosure includes: a first support that supports a display panel; a second support that supports the display panel; a connecting portion that connects the first support and the second support so that the display panel can be bent; a first member that is fixed to the first support and is more flexible than the display panel; a second member that is fixed to the second support and is more flexible than the display panel; a first adhesion layer that adheres the first member to at least a portion of a first surface opposite to a display surface of the display panel; and a second adhesion layer that adheres the second member to at least another portion of the first surface.

16 Claims, 24 Drawing Sheets

(56) References Cited

U.S. PATENT DOCUMENTS

| | | | | |
|---|---|---|---|---|
| 2012/0243207 A1* | 9/2012 | Wang | ............... | G09F 9/30 |
| | | | | 362/97.1 |
| 2012/0307423 A1* | 12/2012 | Bohn | ............... | G06F 1/1652 |
| | | | | 361/679.01 |
| 2012/0314399 A1* | 12/2012 | Bohn | ............... | G06F 1/1652 |
| | | | | 362/97.1 |
| 2014/0285992 A1* | 9/2014 | Yang | ............... | G06F 1/1641 |
| | | | | 361/809 |
| 2014/0355195 A1* | 12/2014 | Kee | ............... | G06F 1/1641 |
| | | | | 361/679.27 |
| 2015/0268697 A1* | 9/2015 | Nam | ............... | B32B 3/30 |
| | | | | 428/157 |
| 2016/0209874 A1* | 7/2016 | Choi | ............... | H05K 1/028 |
| 2017/0115701 A1* | 4/2017 | Bae | ............... | G06F 1/16 |
| 2017/0250355 A1* | 8/2017 | Shirahata | ............... | H01L 51/0097 |
| 2018/0150108 A1* | 5/2018 | Song | ............... | H05K 1/028 |
| 2018/0181165 A1* | 6/2018 | Park | ............... | G06F 1/1652 |
| 2018/0267574 A1* | 9/2018 | Cho | ............... | G06F 3/017 |
| 2019/0315105 A1* | 10/2019 | Isojima | ............... | B32B 27/08 |

\* cited by examiner

SHAFT INTERVAL D

DISPLAY DEVICE

CROSS-REFERENCE TO RELATED APPLICATION

This application is a continuation under 35 U.S.C. 120 of International Application PCT/JP2018/035042 having the International Filing Date of Sep. 21, 2018, and having the benefit of the earlier filing date of Japanese Application No. 2017-240545, filed on Dec. 15, 2017. Each of the identified applications is fully incorporated herein by reference.

BACKGROUND OF THE INVENTION

1. Field of the Invention

One or more embodiments of the present invention relate to a display device.

2. Description of the Related Art

JP 2014-519626 T and U.S. Patent Application Publication No. 2017/0115701 disclose foldable flexible displays. Specifically, JP 2014-519626 T discloses a foldable electronic device including a pivotable structure that connects a first housing portion and a second housing portion to each other. Then, the first housing portion and the second housing portion are formed integrally with corresponding portions of the flexible display. U.S. Patent Application Publication No. 2017/0115701 discloses a foldable flexible display in which a flexible display is fixed to a first support and a second support using an adhesive, a double-sided tape, or the like, and the first and second supports rotate about rotation axes, respectively.

SUMMARY OF THE INVENTION

However, as disclosed in the related art, if a display panel is firmly fixed to a support or the like with an adhesive or the like, stress is easily applied to the display panel due to a folding operation of the display panel, so that the display panel is damaged, in some cases.

One or more embodiments of the present invention have been made in view of the above, an object thereof is to prevent excessive stress from being applied to a display panel in a foldable display device and to prevent the display panel from being damaged.

(1) A display device according to an embodiment of the present invention includes: a first support that supports a display panel; a second support that supports the display panel; a connecting portion that connects the first support and the second support so that the display panel can be bent; a first member that is fixed to the first support and is more flexible than the display panel; a second member that is fixed to the second support and is more flexible than the display panel; a first adhesion layer that adheres the first member to at least a portion of a first surface opposite to a display surface of the display panel; and a second adhesion layer that adheres the second member to at least another portion of the first surface.

(2) In the display device according to the above-mentioned (1), the first member or the second member may have elastic force.

(3) In the display device according to the above-mentioned (2), the first member or the second member may be formed with rubber.

(4) In the display device according to any one of the above-mentioned (1) to (3), a thickness of the first member may be greater than that of the first adhesion layer, and a thickness of the second member may be greater than that of the second adhesion layer.

(5) In the display device according to any one of the above-mentioned (1) to (4), a deformation amount of the first member in an in-plane direction of the display panel in a state in which the display panel is bent may be in a range of a half to three times of a thickness of the first member, and a deformation amount of the second member in the in-plane direction of the display panel in the state in which the display panel is bent may be in a range of a half to three times of a thickness of the second member.

(6) In the display device according to any one of the above-mentioned (1) to (5), the first member may cover an entire area in which the first support and the display panel are overlapped with each other, when the display panel is in a non-curved state, and the second member may cover an entire area in which the second support and the display panel are overlapped with each other, when the display panel is in a non-curved state.

(7) In the display device according to any one of the above-mentioned (1) to (5), the first member may have a frame shape that covers an end portion of an area in which the first support and the display panel are overlapped with each other when the display panel is in a non-curved state, and the second member may have a frame shape that covers an end portion of an area in which the second support and the display panel are overlapped with each other, when the display panel is in a non-curved state.

(8) In the display device according to any one of the above-mentioned (1) to (5), the first member may include a first rod-like portion positioned in an area in which the first support and the display panel are overlapped with each other, when the display panel is in a non-curved state, and the second member may include a second rod-like portion positioned in an area in which the second support and the display panel are overlapped with each other when the display panel is in a non-curved state. Here, the display panel may include an overlapping area with the connecting portion and a panel end portion that is not overlapped with the connecting portion, and the first and second rod-like portions may extend from a side on which the connecting portion is positioned to a side on which the panel end portion is positioned.

(9) The display device according to any one of the above-mentioned (1) to (8) may further include: a protection sheet that protects the display panel; a third member that is more flexible than the display panel; and a third adhesion layer that adheres the third member to at least a portion of a second surface side on the display surface of the display panel.

(10) In the display device according to the above-mentioned (9), the third member may have elastic force, and the third member may be formed with rubber.

(11) In the display device according to the above-mentioned (9) or (10), a thickness of the third member may be greater than that of the third adhesion layer.

(12) In the display device according to any one of the above-mentioned (9) to (11), a deformation amount of the third member in an in-plane direction of the display panel in a state in which the display panel is bent may be in a range of a half to three times of a thickness of the third member.

(13) In the display device according to any one of the above-mentioned (9) to (12), the third member may cover an entire area in which the protection sheet and the display panel are overlapped with each other, when the display panel is in a non-curved state.

(14) In the display device according to any one of the above-mentioned (9) to (12), the third member may have a frame shape that covers an end portion of the protection sheet.

(15) In the display device according to any one of the above-mentioned (9) to (12), the third member may include a third rod-like portion positioned in an area in which the protection sheet and the display panel are overlapped with each other when the display panel is in a non-curved state.

(16) In the display device according to the above-mentioned (15), the display panel may include a first end portion positioned on a side opposite to the connecting portion of the first support and a second end portion positioned on a side opposite to the connecting portion of the second support, and the third rod-like portion may be positioned in a direction in which the first end portion and the second end portion are linked to each other.

DETAILED DESCRIPTION OF THE INVENTION

Figure 1:
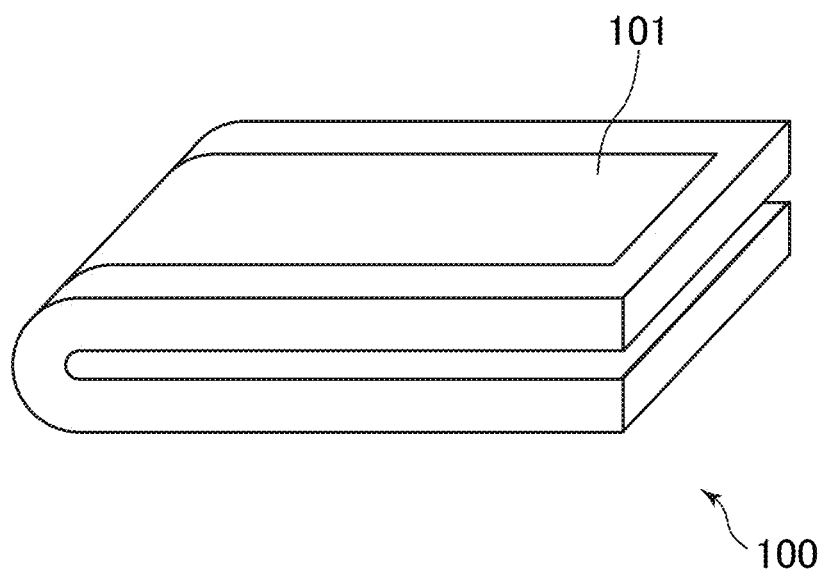
FIG. 1 is a diagram illustrating an example of an appearance of a display device according to the present embodiment.

Hereinafter, each embodiment of the present invention will be described with reference to the drawings. It should be noted that the disclosure is merely an example, and appropriate changes while maintaining the gist of the invention that can be easily conceived by those skilled in the art are naturally included in the scope of the present invention. In order to make the description clearer, the width, thickness, shape, and the like of each part may be schematically illustrated in the drawings as compared with the embodiment in some cases, but these are merely an example and do not limit the interpretation of the present invention. In the specification and the drawings, components similar to those described with respect to drawing previously provided are denoted by like reference numerals and detailed descriptions thereof may be omitted as appropriate.

First Embodiment

FIG. 1 is a diagram illustrating an example of the appearance of a display device according to the present embodiment. As illustrated in FIG. 1, a sheet-like display panel 101 included in a display device 100 is flexible, foldable, and used in a bent portion set in advance as described below. The external appearance illustrated in FIG. 1 is an example, and may have another external appearance. For example, in the present embodiment, for convenience of description, the display device 100 that is folded so that a display screen that displays a screen is on the outside is described, but other configurations such as a configuration of being folded inward may be used. As the display panel, for example, a flexible organic electro-luminescent (organic EL) display panel is used.

Figure 2:
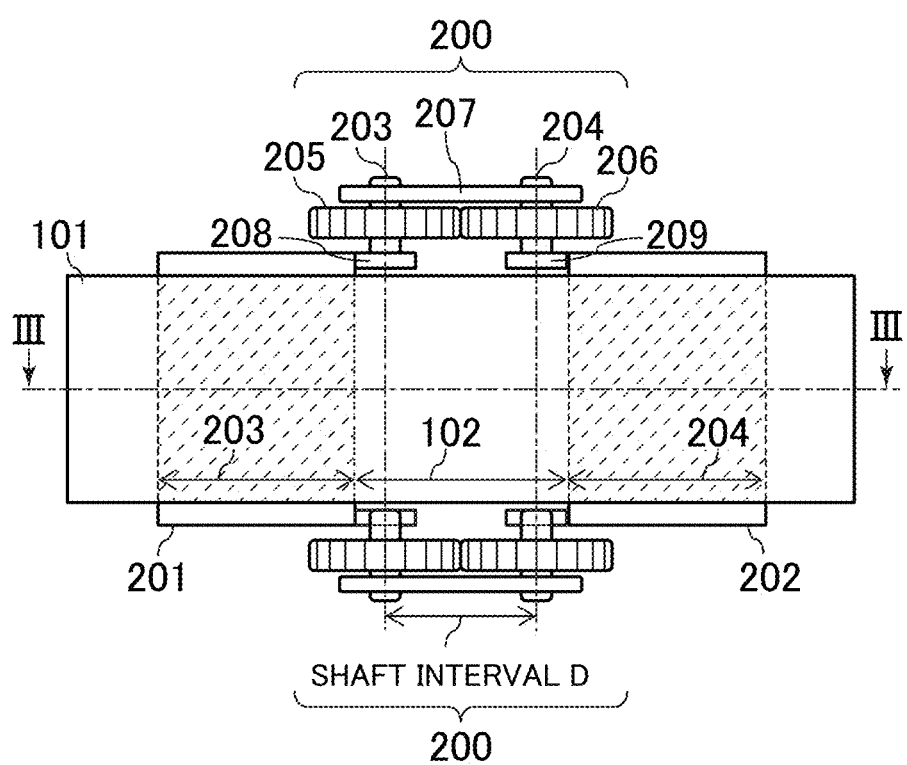
FIG. 2 is a plan view illustrating an example of the display device illustrated in FIG. 1 in an unfolded state.
Figure 3:
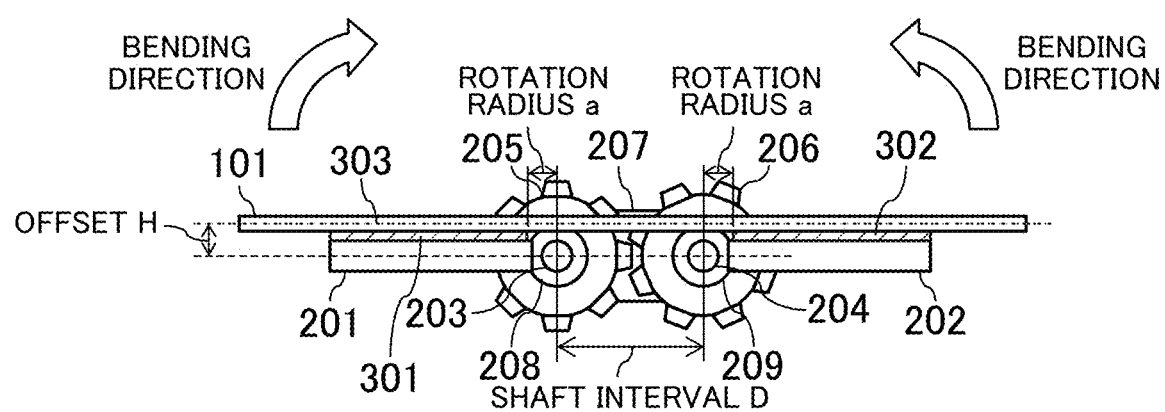
FIG. 3 is a diagram illustrating an example of a cross section taken along line III-III in FIG. 2.
Figure 4:
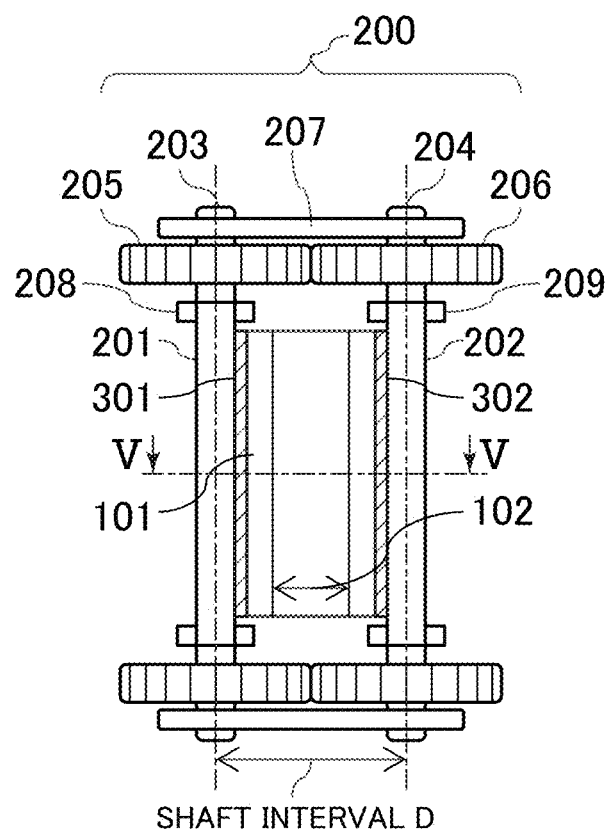
FIG. 4 is a plan view illustrating an example of the display device illustrated in FIG. 1 in a bent state according to a first embodiment.
Figure 5:
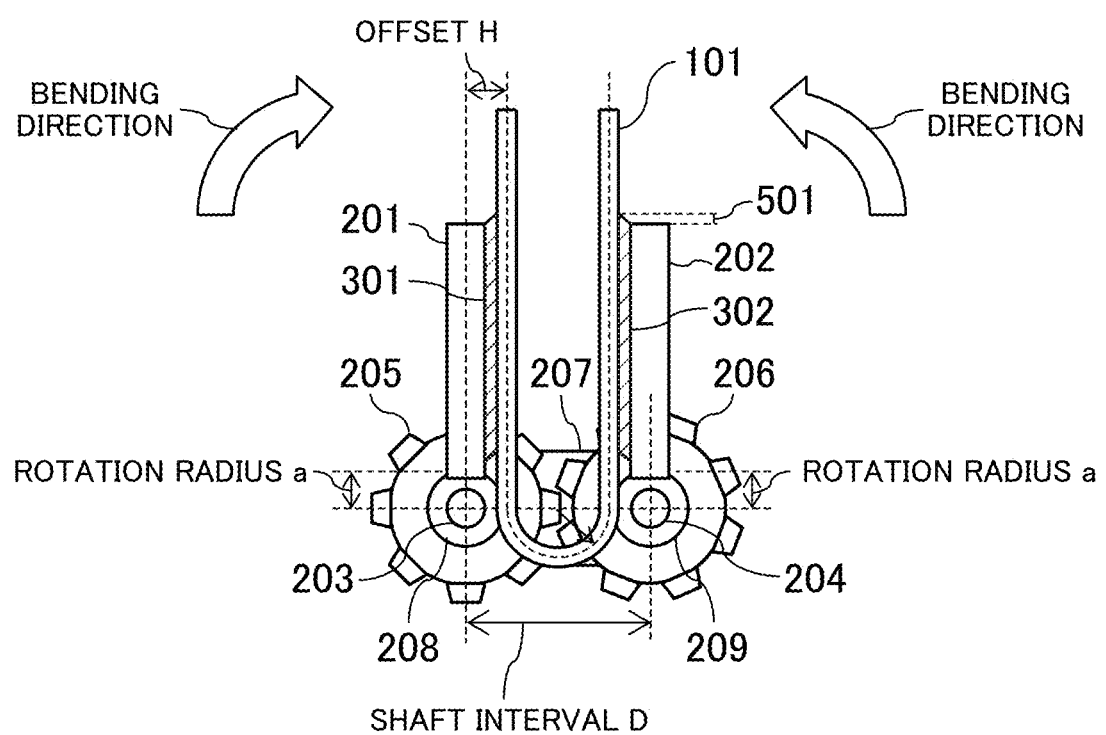
FIG. 5 is a diagram illustrating an example of a cross section taken along line V-V of FIG. 4.

FIG. 2 is a plan view illustrating an example of the display device illustrated in FIG. 1 in an unfolded state. FIG. 3 is a diagram illustrating an example of a cross section taken along line III-III in FIG. 2. FIG. 4 is a plan view illustrating an example of the display device illustrated in FIG. 1 in a bent state. FIG. 5 is a diagram illustrating an example of a cross section taken along line V-V of FIG. 4.

As illustrated in FIGS. 2 to 5, the display device 100 includes the display panel 101; a first support 201 and a second support 202 that support the display panel 101; and connecting portion 200 that connects the first support 201 and the second support 202 so that the display panel 101 can be bent. The display device 100 includes a first member 301 that is fixed to the first support 201 and more flexible than the display panel 101, and a second member 302 that is fixed to the second support 202 and more flexible than the display panel 101. The display device 100 further includes a first adhesion layer (not illustrated) that adheres the first member 301 to a first portion that is at least a portion of a first surface (a back surface of the display panel 101) opposite to a display surface of the display panel 101, and a second adhesion layer (not illustrated) that adheres the second member 302 to a second portion that is at least a portion of a back surface of the display panel 101.

As the material of the first support 201 or the second support 202, for example, metal or plastic is used. The first member 301 and the second member 302 are formed, for example, with sheet-like rubber having elastic force. As the material of the first member 301 and the second member 302, not only a general rubber product represented by butyl rubber, but also a resin such as a polyrotaxane-based resin having elasticity may be used.

The thicknesses of the first member 301 and the second member 302 are greater than those of the first adhesion layer and the second adhesion layer. For example, the thicknesses of the first member 301 and the second member 302 are preferably 0.1 mm or more. As described below, deformation amounts 501 of the first member 301 and the second member 302 in the in-plane direction in the bent state are preferably in the range of about a half to three times of the thicknesses of the first member 301 and the second member 302.

Figure 6:
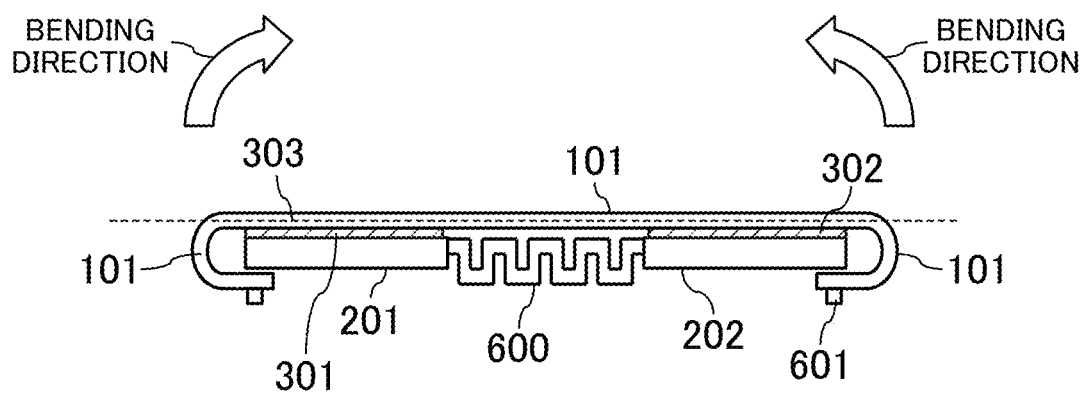
FIG. 6 is a diagram for describing a case where a driving IC is provided in an end portion of a display panel.

Subsequently, the shapes of the first member 301 and the second member 302 are described. For example, as illustrated in FIG. 2 or the like, the shapes of the first member 301 and the second member 302 are a plane shape (sheet shape) to cover the entire area (hatched portions with broken lines in FIG. 2) in which the first support 201 and the second support 202 are overlapped with the first member 301 and the second member 302. Here, in FIG. 2, the overlapping area is a portion of the display panel 101 excluding a bent portion 102 described below. Therefore, for example, as illustrated in FIG. 6, when the display panel 101 is bent to the back side of the display screen and a driving IC 601 and the like that are provided on the outside of the display area of the display panel 101 are arranged in the bent part of the display panel 101, a frame area which is an external portion of the display area of the display panel 101 can be narrowed down. FIG. 6 illustrates a case where a bellows-like connecting portion 600 described below is used, but it is obvious that the configuration can be applied to a case where another connecting portion, for example, the connecting portions 200 illustrated in FIG. 2 and the like is used. The same is applied to FIGS. 7 to 11 described below. Details of the configuration of the bellows-like connecting portion 600 are described below as a modification example.

The configuration illustrated in FIG. 2 is an example, and another configuration may be used. For example, the first support 201 and the second support 202 have the same size as the area of the display panel 101 excluding the bent portion 102 in the longitudinal direction of the display panel 101, and the shapes of the first member 301 and the second member 302 may be a plane shape to cover the entire area in which the first support 201 and the second support 202 are overlapped with the first member 301 and the second member 302.

Figure 7:
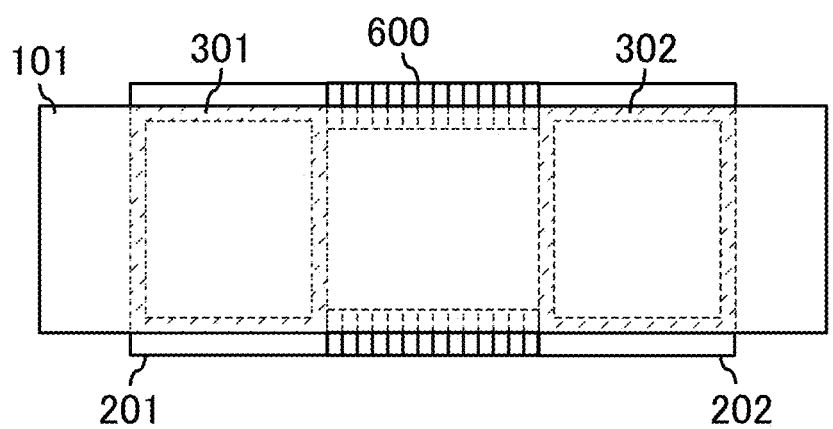
FIG. 7 is a diagram illustrating another example of shapes of a first member and a second member.

As illustrated in FIG. 7, the shapes of the first member 301 and the second member 302 may be configured to be a shape arranged at an end portion of the area in which the first support 201 and the second support 202 are overlapped with the first member 301 and the second member 302. In other words, the shapes of the first member 301 and the second member 302 may be formed in a frame shape in which the end portion of the overlapping area is surrounded with a frame.

Figure 8:
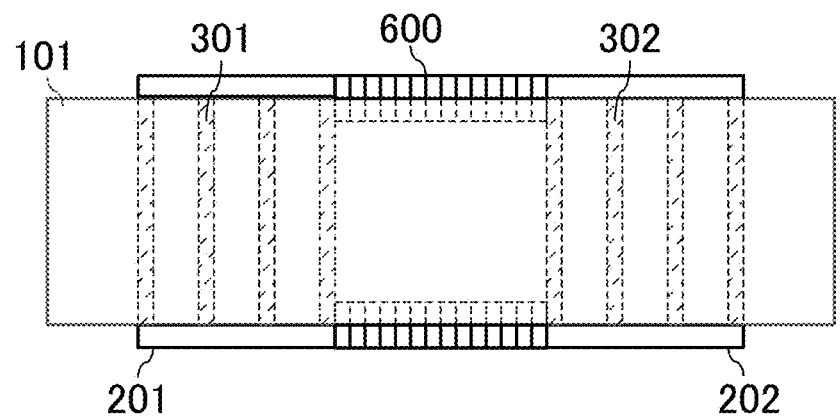
FIG. 8 is a diagram illustrating another example of shapes of the first member and the second member.

As illustrated in FIG. 8, the shapes of the first member 301 and the second member 302 may be configured to be a shape of being arranged in the area in which the first support 201 and the second support 202 are overlapped with the first member 301 and the second member 302 and also a shape of including a plurality of rod-like members. Here, for example, as illustrated in FIG. 8, the plurality of rod-like members may be configured to be arranged side by side in an order from the bent portion (for example, substantially the center portion of the display screen in FIG. 8) of the display panel 101 to the outside of the display panel 101. Specifically, for example, the plurality of rod-like members may have the shape arranged side by side at equal intervals.

Figure 9:
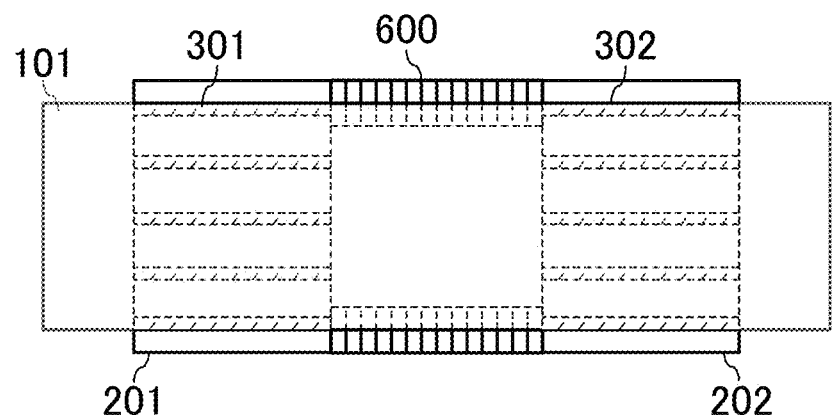
FIG. 9 is a diagram illustrating another example of shapes of the first member and the second member.

As illustrated in FIG. 9, the shapes of the first member 301 and the second member 302 may be a shape in which the plurality of rod-like members are arranged side by side to stretch from the bent portion 102 to the outside of the display screen. Here, for example, compared with the case illustrated in FIG. 7 or 8, when the display panel 101 is bent, the display panel 101 is not likely to wrinkle. As illustrated in FIG. 9, for example, the plurality of rod-like members may be configured to be arranged side by side at equal intervals or may be configured to be arranged side by side at other intervals.

Figure 10:
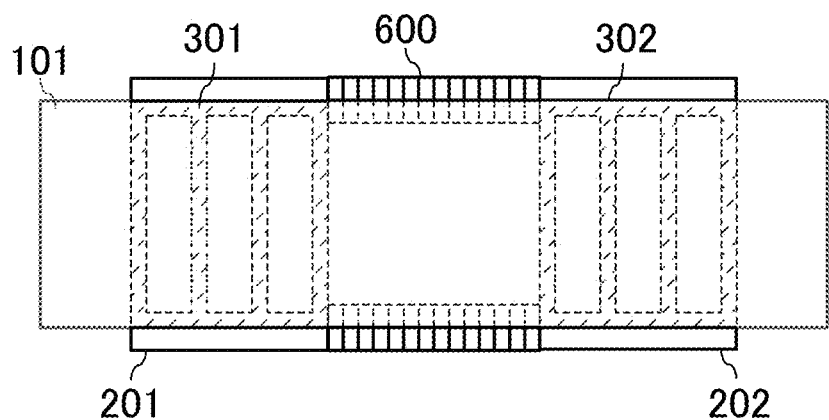
FIG. 10 is a diagram illustrating another example of shapes of the first member and the second member.
Figure 11:
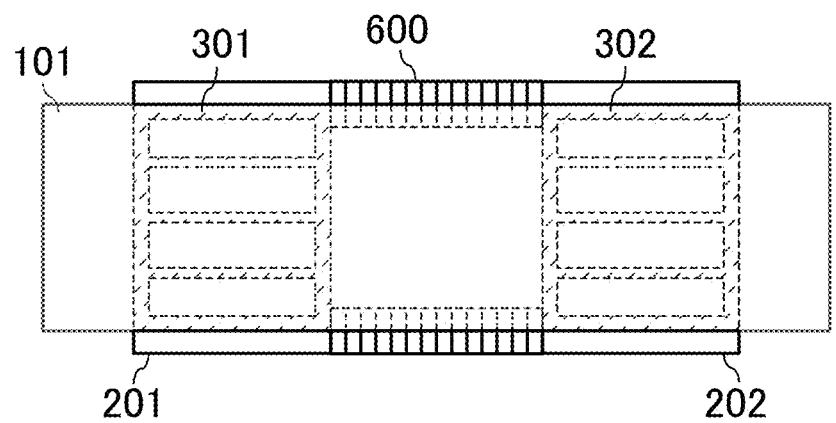
FIG. 11 is a diagram illustrating another example of shapes of the first member and the second member.

The shapes of the first member 301 and the second member 302 may be a shape in which the plurality of rod-like members are connected with a frame-like member, such as a shape illustrated in FIG. 10 obtained by combining FIGS. 7 and 8 and a shape illustrated in FIG. 11 obtained by combining FIGS. 7 and 9. The shapes of the first member 301 and the second member 302 described above are provided as examples, and may be other shapes.

Subsequently, an example of the specific configuration of the connecting portion 200 is described. As illustrated in FIGS. 2 to 5, for example, the connecting portion 200 includes a first shaft 203 and a second shaft 204 that are substantially parallel to each other, a first gear 205 and a second gear 206 that are engaged with end portions of the first shaft 203 and the second shaft 204, a holding member 207 that rotatably holds the end portions of the first shaft 203 and the second shaft 204, and a first fixing portion 208 and a second fixing portion 209 that fix the first support 201 and the second support 202 to the end portions of the first shaft 203 and the second shaft 204. As illustrated in FIG. 3, in an unfolded state of the display panel 101, the first support 201 and the second support 202 are fixed to the first fixing portion 208 and the second fixing portion 209 at the position separated from the rotation center of the first shaft 203 and the second shaft 204 by a rotation radius a, in the direction facing the outside of the display panel 101 from the first shaft 203 and the second shaft 204 adjacent to each other. If a shaft interval between the first shaft 203 and the second shaft 204 is set to D, and for example, the length of the bent portion 102 is set to L, L satisfies the relationship of L=D+2a. In FIG. 2 and the like, a configuration in which the connecting portions 200 are provided on both sides of the display panel 101 (for example, the upper side and the lower side of FIG. 2), respectively is illustrated, but other configurations may be used. For example, the display device 100 may be configured to include only one connecting portion 200 having the same configuration.

As illustrated in FIG. 3, the display panel 101 is arranged so that a neutral plane 303 of the display panel 101 is offset by an offset amount H (0 or more) with respect to the virtual plane including the first shaft 203 and the second shaft 204. Fixing positions of the first support 201 and the second support 202 may be set so that the offset amount H is 0. Here, the display panel 101 can be configured to be bent so that the display surface of the display panel 101 is on the outside of the display device 100.

Subsequently, an operation of the display panel 101 from an unfolded state to a bent state is described. As understood in FIGS. 4 and 5, by the bending operation (operation in a bending direction of FIG. 5) of the display panel 101, the first gear 205 and the second gear 206 rotate in a reverse direction from each other. Accordingly, fixing surfaces of the first support 201 and the second support 202 come close to each other, and the display panel 101 can be bent in a U shape so that the display surface of the display panel 101 is inside of the display device 100. During the deformation, as illustrated in FIG. 5, the display panel 101 is deviated in the parallel direction to the surfaces of the first support 201 and the second support 202 by repulsive force due to its own elasticity, but since the first member 301 and the second member 302 fixed to the first support 201 and the second support 202 are more flexible than the display panel 101, the deviation is absorbed by the deformation of the first member 301 and the second member 302. Here, as described above, the deformation amounts 501 (corresponding to the deviation) of the first member 301 and the second member 302 in the bent state in the in-plane direction are preferably in the range of about a half to three times of the thicknesses of the first member 301 and the second member 302, respectively. Therefore, it is possible to prevent the excessive stress from being applied to the display panel 101, and thus it is possible to effectively prevent the damage of the display panel 101 due to the deviation. Here, a portion (the bent portion 102) between the first support 201 and the second support 202 of the display panel 101 can be freely deformed, and thus the display panel 101 is bent.

In order to prevent the collision between the display surfaces of the display panel 101 with each other caused by excessive bending, a stopper portion (not illustrated) that prevents bending at a predetermined bending angle or more may be provided. The shaft interval D which is a shaft interval of the first shaft 203 and the second shaft 204, the rotation radiuses a of the first support 201 and the second support 202, the offset amount H, and the length L of the bent portion 102 are designed considering a radius of curvature R of the display panel 101 or the like. That is, according to the design, the rotation radius a, the offset amount H, the length L of the bent portion 102, and the like may be configured to be different from the above. For example, in the above, the rotation radiuses a are the same on the left and the right of FIG. 3, but may be different from each other according to the design.

The present invention is not limited to the above embodiment, and various modifications are possible. The configuration described in the above embodiment can be replaced with a substantially identical configuration, a configuration having the same operation and effect, or a configuration that can achieve the same object.

Figure 12:
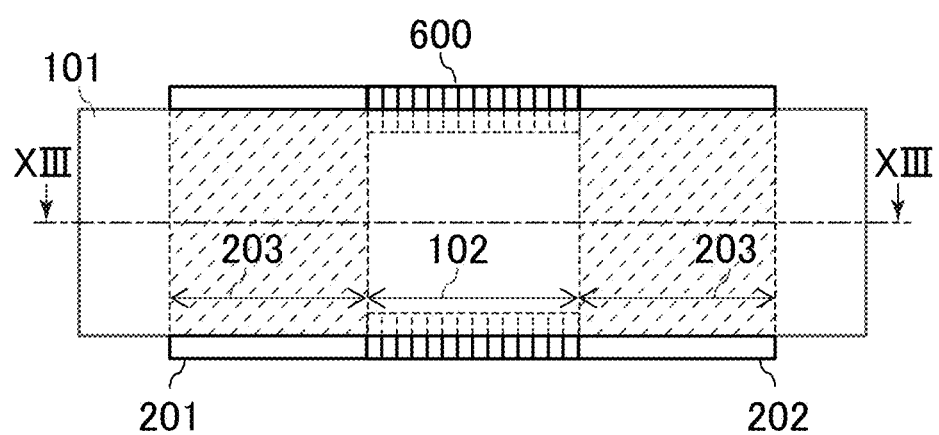
FIG. 12 is a plan view illustrating an example of the display device illustrated in FIG. 1 in an unfolded state in a modification example.
Figure 13:
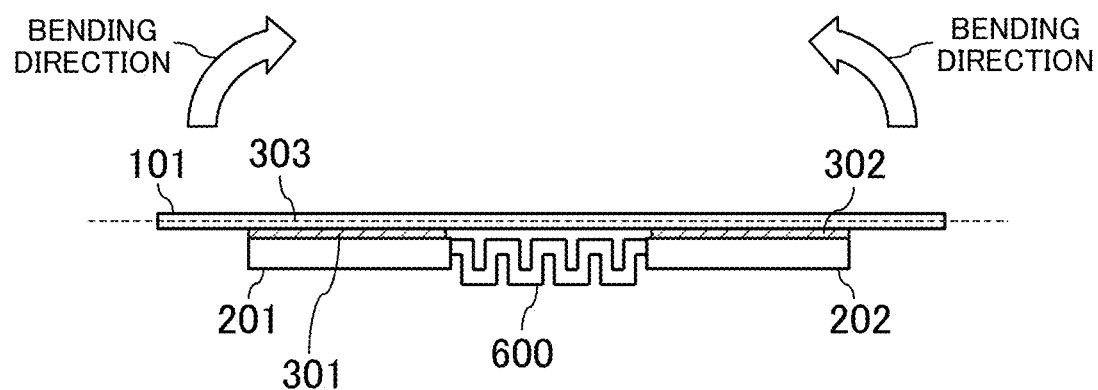
FIG. 13 is a diagram illustrating an example of a cross section taken along line XIII-XIII of FIG. 12.
Figure 14:
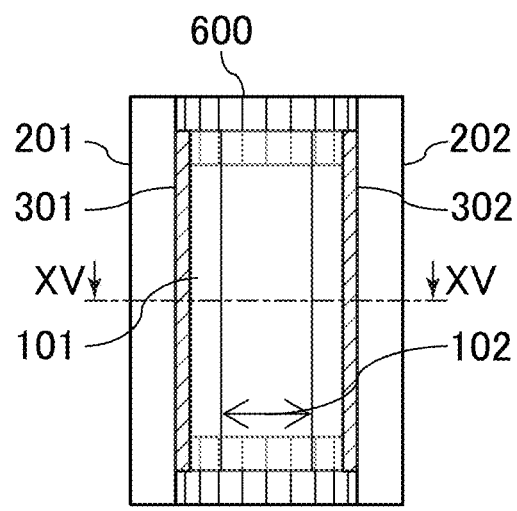
FIG. 14 is a plan view illustrating an example of the display device illustrated in FIG. 12 in a bent state.
Figure 15:
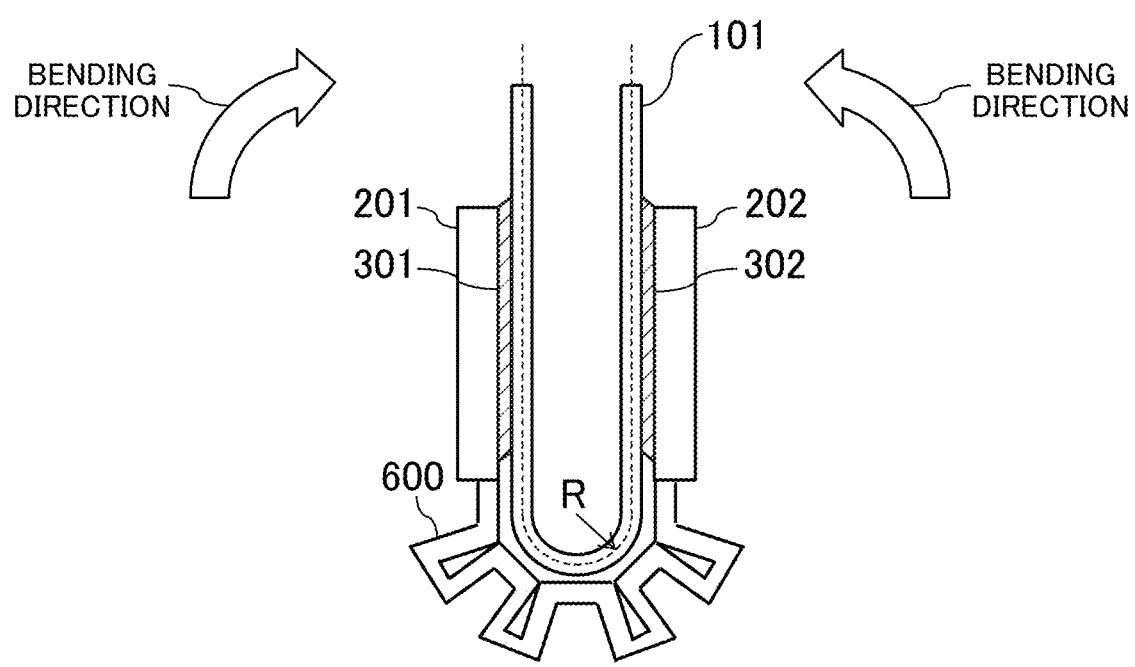
FIG. 15 is a diagram illustrating an example of a cross section taken along line XV-XV of FIG. 14.

Specifically, for example, as in the following modified example, instead of the connecting portion 200 of the above embodiment, it may be configured with the bellows-like connecting portion 600. Here, FIG. 12 is a plan view illustrating an example of the display device illustrated in FIG. 1 in an unfolded state in the present modification example. FIG. 13 is a diagram illustrating an example of a cross section taken along line XIII-XIII of FIG. 12. FIG. 14 is a plan view illustrating an example of the display device illustrated in FIG. 12 in a bent state. FIG. 15 is a diagram illustrating an example of a cross section taken along line XV-XV of FIG. 14.

As illustrated in FIG. 12 or 13, or the like, the connecting portion 600 has a bellows shape that is bendable and flexible, and is connected to end portions of the first support 201 and the second support 202. The bellows shape is configured with, for example, thin metal. The bellows shape illustrated in FIG. 12 and the like is an example, and may have other shapes. Specifically, for example, as long as the shape is bendable, the shape may be a sheet shape, or may be a shape in which a V shape or a U shape is repeatedly formed in a cross-sectional view. FIGS. 12 to 15 illustrate cases where the connection is formed by two connecting portions 600, but may be configured by one connecting portion 600. Here, the connecting portion 600 may be configured to be formed in the entire portion between the first support 201 and the second support 202.

According to the present modification example, as illustrated in FIG. 15, since the bellows-like connecting portion 600 is bent in a direction substantially perpendicular to the fold of the bellows by the bending operation of the display panel 101, the display panel 101 can be bent in a U shape having a predetermined curvature R so that the surfaces of the first support 201 and the second support 202 come close to each other, and the display surface of the display panel 101 becomes the inside. As described in the first embodiment, the first member 301 and the second member 302 may be planar as illustrated in FIG. 2 or may be a frame shape, a shape of a plurality of rods, or the like as illustrated in FIGS. 7 to 11.

Second Embodiment

Figure 16:
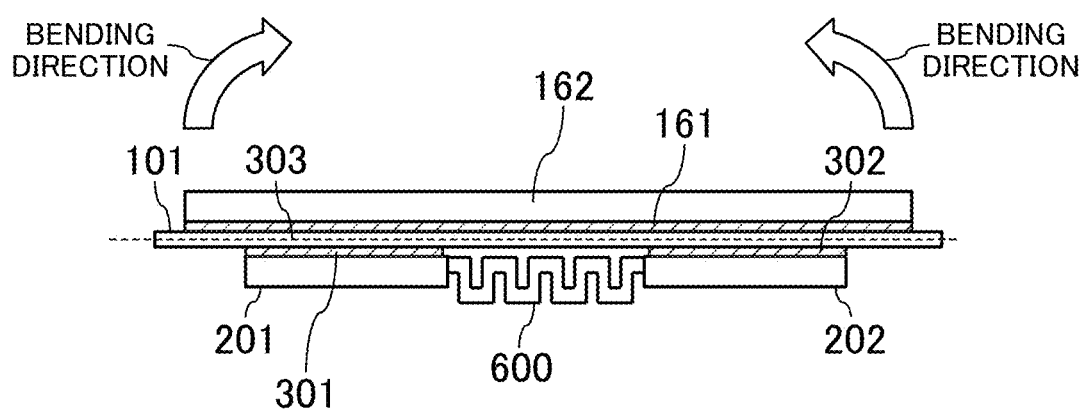
FIG. 16 is a diagram illustrating an example of a cross section of the display device illustrated in FIG. 1 in a second embodiment.

Subsequently, the second embodiment of the present invention is described. As illustrated in FIG. 16, the present embodiment is mainly different from the first embodiment in that a third member 161 which is more flexible than the display panel 101 is also provided on the display screen side of the display panel 101. Hereinafter, those which are the same as the first embodiment are not described.

FIG. 16 is a diagram illustrating an example of a cross section of the display device illustrated in FIG. 1 in the present embodiment. As illustrated in FIG. 16, in addition to the first member 301 and the second member 302, the third member 161 and a third adhesion layer (not illustrated) that adheres the third member 161 to a third portion which is at least a portion of the surface of the display panel 101 are provided on the surface on the display surface side of the display panel 101. The third member 161 is fixed to a surface protection sheet 162 that protects the display panel 101. The material of the third member 161 and the thickness or the deformation amount of the third member are the same as those of the first member 301 and the second member 302. That is, the thickness of the third member 161 is greater than the thickness of the third adhesion layer. For example, the thickness of the third member 161 is preferably 0.1 mm or more. The deformation amount of the third member 161 in the in-plane direction in the bent state is preferably about a half to three times of the thickness of the third member 161.

Figure 17:
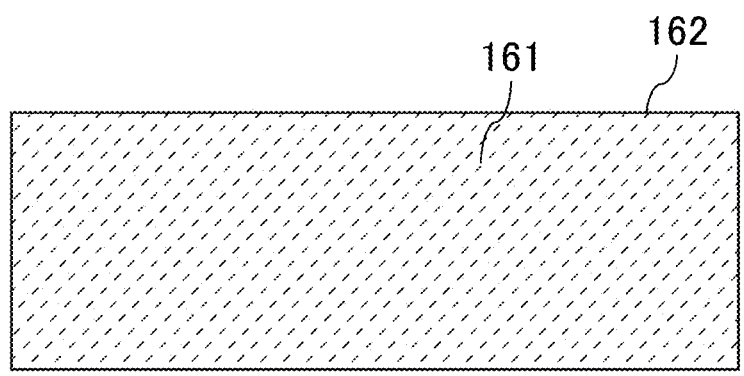
FIG. 17 is a diagram illustrating an example of a third member.

The shape of the third member 161 is configured to be the same, for example, as the shapes of the first member 301 and the second member 302. Specifically, for example, as illustrated in FIG. 17, the third member 161 is formed in a plane shape (sheet shape) that covers at least a portion of the overlapping area of the surface protection sheet 162 and the third member 161. Here, in order to not influence on the display of the display panel 101, the third member 161 is configured with an optically transparent material. Specifically, for example, the material of the third member 161 is configured with a material which is the same as those of the first member 301 and the second member 302, excluding a transparent material. Here, it is obvious that, the materials of the first member 301 and the second member 302 may be transparent.

Figure 18:
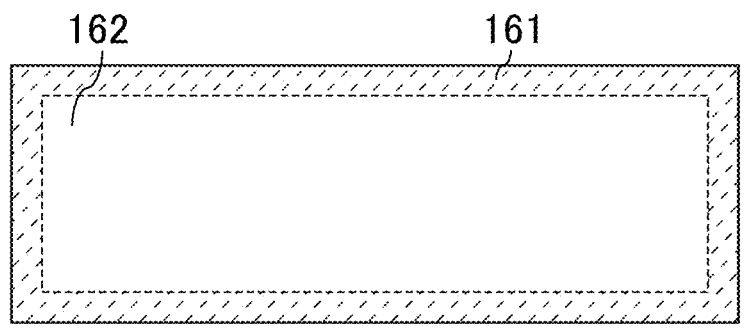
FIG. 18 is a diagram illustrating another example of the third member.

As illustrated in FIG. 18, the shape of the third member 161 may be a shape of being arranged on at least a portion of the end portion of the overlapping area of the surface protection sheet 162 and the third member 161, for example, a frame shape. Here, for example, the influence of the third member 161 on the display of the display panel 101 can be prevented by arranging the third member 161 in the frame area positioned outside of the display area of the display panel 101. Here, the third member 161 is not required to be a transparent material.

Figure 19:
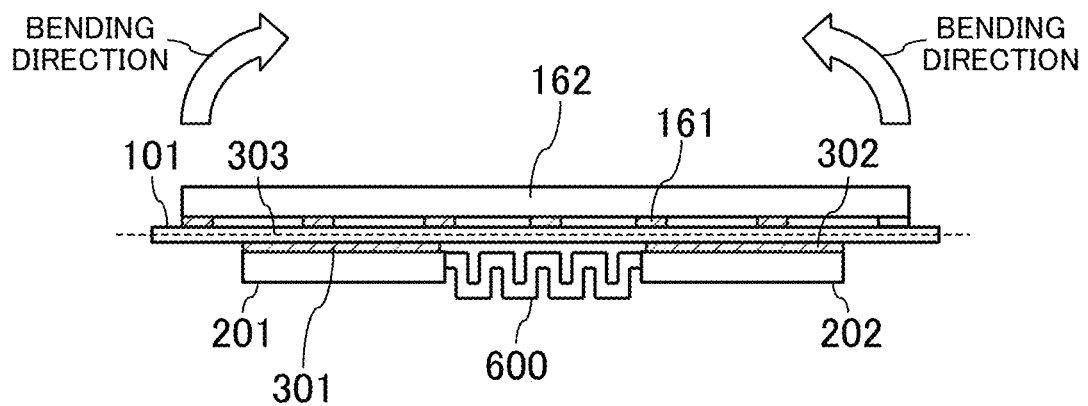
FIG. 19 is a diagram illustrating another example of a cross section of the display device illustrated in FIG. 16.
Figure 20:
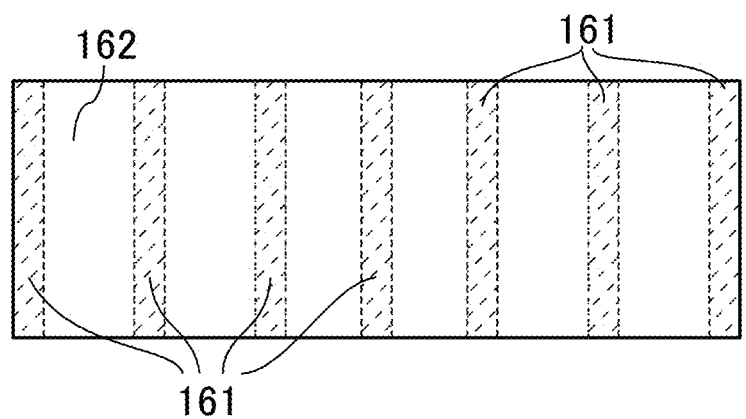
FIG. 20 is a diagram illustrating a shape of the third member illustrated in FIG. 19.
Figure 21:
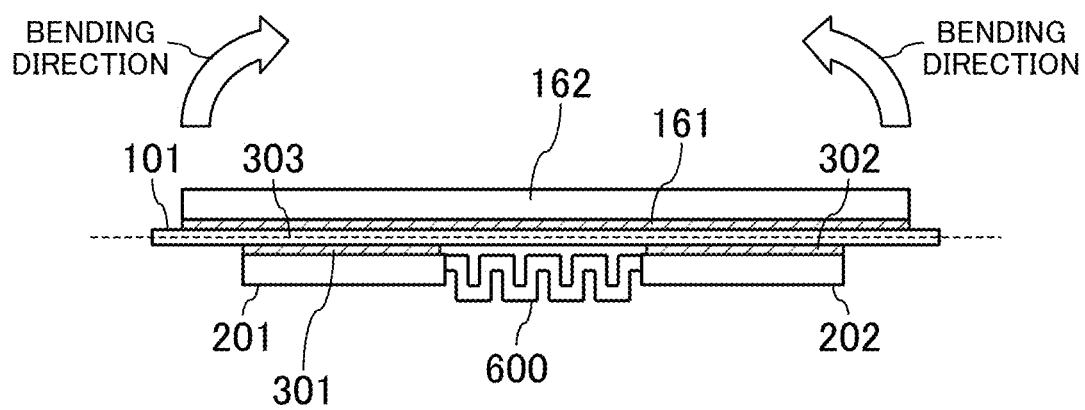
FIG. 21 is a diagram illustrating another example of the cross section of the display device illustrated in FIG. 16.
Figure 22:
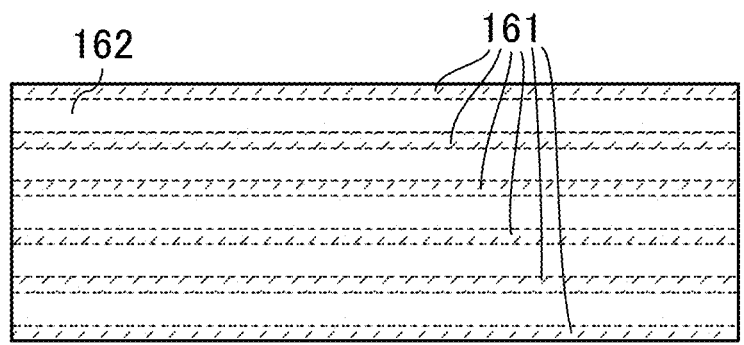
FIG. 22 is a diagram illustrating the shape of the third member illustrated in FIG. 20.

As illustrated in FIGS. 19 and 20, the third member 161 may be configured to be formed with a plurality of rod-like members. Specifically, as illustrated in FIGS. 19 and 20, the third member 161 may be configured to be a shape in which the plurality of rod-like members are arranged side by side from the central portion to the outside of the display panel 101. As illustrated in FIGS. 21 and 22, the third member 161 may have a shape in which the rod-like members are arranged side by side to stretch from the central portion to the left and the right of the display panel 101. Here, compared with the case illustrated in FIGS. 19 and 20, for example, when the display panel 101 is bent, the surface protection sheet 162 or the display panel 101 is not likely to wrinkle.

Figure 23:
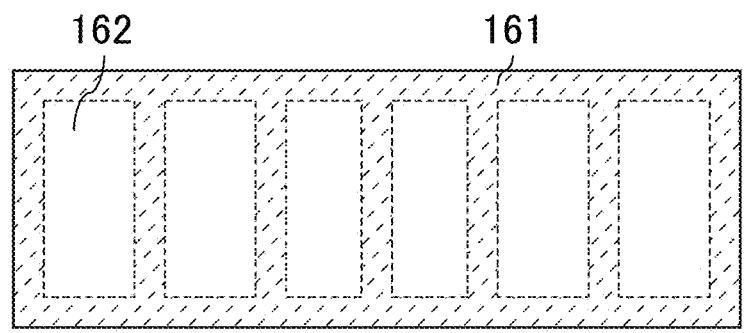
FIG. 23 is a diagram illustrating another example of the shape of the third member.
Figure 24:
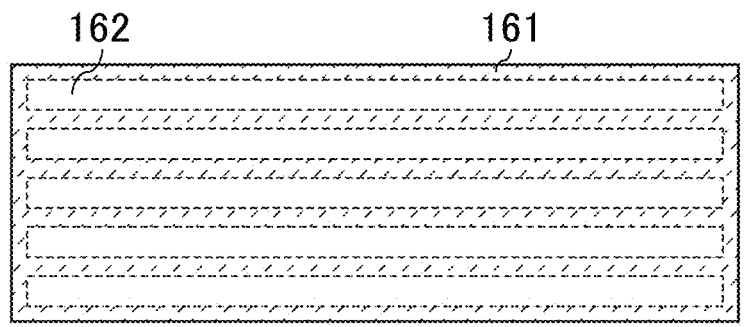
FIG. 24 is a diagram illustrating another example of the shape of the third member.

By combining FIGS. 18 and 20 or FIGS. 18 and 22, the third member 161 may have a shape in which the plurality of rod-like members are connected to a frame shape member as illustrated in FIGS. 23 and 24, respectively.

As illustrated in FIG. 19, it is preferable that the neutral plane 303 of the display device 100 is designed to be arranged at the position of the display panel 101 in a cross-sectional view. Accordingly, the display panel 101 is bendable on the both sides of the display surface side and the opposite side of the display surface of the display panel 101.

According to the present invention, in the same manner as the first embodiment, if the display panel 101 is deformed from the unfolded state to the bent state, the display panel 101 is deviated in the direction parallel to the surfaces of the first support 201 and the second support 202 by a repulsive force due to its own elasticity. However, since the first member 301 and the second member 302 fixed to the first support 201 and the second support 202 are more flexible than the display panel 101, the deviation is absorbed by the deformation of the first member 301 and the second member 302. Therefore, it is possible to prevent the excessive stress from being applied to the display panel 101, and thus it is possible to effectively prevent the damage of the display panel 101 due to the deviation. According to the present embodiment, when the display panel 101 is bent by the third member 161, the force of the display panel 101 in the in-plane direction that works between the surface protection sheet 162 and the display panel 101 can be absorbed by the deformation of the third member 161, it is possible to prevent the excessive stress from being applied to the display panel 101, and the damage of the display panel 101 can be effectively prevented by the deviation.

The present invention is not limited to the above embodiments, and various modifications are possible. The configuration described in the above embodiment can be replaced with a substantially identical configuration, a configuration having the same operation and effect, or a configuration that can achieve the same object.

For example, in the second embodiment, a case where the bellows-like connecting portion 600 is used is mainly described. However, also in the second embodiment, the connecting portion 200 described in the first embodiment may be used, and other connecting portions may be used. In the above, the cases where the first member 301, the second member 302, and the third member 161 have a plane shape, a frame shape, and a shape including a plurality of rods or the like are described, but other shapes may be possible. The first to third members 301, 302, and 161 may be configured to have the same shape such as a plane shape, a frame shape, and a shape including a plurality of rods or the like or may be configured to have different shapes. Specifically, for example, the first member 301 and the second member 302 are formed with the plurality of rod-like members, and the third member 161 is formed in a frame shape. The first to third members 301, 302, and 161 may be formed with the same material or may be configured with different materials. For example, a transparent material is used only in the third member 161.

Within the scope of the concept of the present invention, those skilled in the art can conceive various changes and modifications, and it is understood that these changes and modifications also belong to the scope of the present invention. For example, in the above embodiments, those obtained by appropriately adding and deleting components, or changing the design thereof, or adding and omitting the process or changing the conditions thereof by those skilled in the art are included in the scope of the present invention.

What is claimed is:

1. A display device comprising:
a first support that supports a display panel;
a second support that supports the display panel;
a connecting portion that connects the first support and the second support so that the display panel can be bent;
a first member that is fixed to the first support and is more flexible than the display panel;
a second member that is fixed to the second support and is more flexible than the display panel;
a first adhesion layer that adheres the first member to at least a portion of a first surface opposite to a display surface of the display panel; and
a second adhesion layer that adheres the second member to at least another portion of the first surface;
a protection sheet that protects the display panel;
a third member that is more flexible than the display panel; and
a third adhesion layer that adheres the third member to at least a portion of a second surface side on the display surface of the display panel; and
wherein a deformation amount of the third member in an in-plane direction of the display panel in a state in which the display panel is bent is in a range of a half to three times of a thickness of the third member.

2. The display device according to claim 1, wherein the first member or the second member has elastic force.

3. The display device according to claim 2, wherein the first member or the second member is formed with rubber.

4. The display device according to claim 1, wherein a thickness of the first member is greater than that of the first adhesion layer.

5. The display device according to claim 1, wherein a thickness of the second member is greater than that of the second adhesion layer.

6. The display device according to claim 1, wherein a deformation amount of the first member in an in-plane direction of the display panel in a state in which the display panel is bent is in a range of a half to three times of a thickness of the first member, and a deformation amount of the second member in the in-plane direction of the display panel in the state in which the display panel is bent is in a range of a half to three times of a thickness of the second member.

7. The display device according to claim 1, wherein the first member covers an entire area in which the first support and the display panel are overlapped with each other, when the display panel is in a non-curved state, and the second member covers an entire area in which the second support and the display panel are overlapped with each other, when the display panel is in a non-curved state.

8. The display device according to claim 1, wherein the first member has a frame shape that covers an end portion of an area in which the first support and the display panel are overlapped with each other when the display panel is in a non-curved state, and the second member has a frame shape that covers an end portion of an area in which the second support and the display panel are overlapped with each other, when the display panel is in a non-curved state.

9. The display device according to claim 1, wherein the first member includes a first rod-like portion positioned in an area in which the first support and the display panel are overlapped with each other, when the display panel is in a non-curved state, and the second member includes a second rod-like portion positioned in an area in which the second support and the display panel are overlapped with each other when the display panel is in a non-curved state.

10. The display device according to claim 9, wherein the display panel includes an overlapping area with the connecting portion and a panel end portion that is not overlapped with the connecting portion, and the first and second rod-like portions extend from a side on which the connecting portion is positioned to a side on which the panel end portion is positioned.

11. The display device according to claim 1, wherein the third member has elastic force.

12. The display device according to claim 1, wherein a thickness of the third member is greater than that of the third adhesion layer.

13. The display device according to claim 1, wherein the third member covers an entire area in which the protection sheet and the display panel are overlapped with each other, when the display panel is in a non-curved state.

14. The display device according to claim 1, wherein the third member has a frame shape that covers an end portion of the protection sheet.

15. The display device according to claim 1, wherein the third member includes a third rod-like portion positioned in an area in which the protection sheet and the display panel are overlapped with each other when the display panel is in a non-curved state.

16. The display device according to claim 15, wherein the display panel includes a first end portion positioned on a side opposite to the connecting portion of the first support and a second end portion positioned on a side opposite to the connecting portion of the second support, and the third rod-like portion is positioned in a direction in which the first end portion and the second end portion are linked to each other.

* * * * *